US008346980B2

(12) United States Patent
Schauer

(10) Patent No.: US 8,346,980 B2
(45) Date of Patent: Jan. 1, 2013

(54) MODULAR INPUT/OUTPUT BRIDGE SYSTEM FOR SEMICONDUCTOR PROCESSING EQUIPMENT

(75) Inventor: Ronald Vern Schauer, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 159 days.

(21) Appl. No.: 12/775,258

(22) Filed: May 6, 2010

(65) Prior Publication Data

US 2010/0285724 A1 Nov. 11, 2010

Related U.S. Application Data

(60) Provisional application No. 61/176,312, filed on May 7, 2009.

(51) Int. Cl.
*G06F 3/00* (2006.01)
*H01L 21/00* (2006.01)

(52) U.S. Cl. ................................................ 710/7; 438/1

(58) Field of Classification Search ........... 710/7; 438/1
See application file for complete search history.

(56) References Cited

U.S. PATENT DOCUMENTS 6,018,729 A * 1/2000 Zacharia et al. ................ 706/21
6,682,399 B1 1/2004 Lai et al.
2003/0182015 A1* 9/2003 Domaille et al. ............. 700/164
2004/0166771 A1 8/2004 Saldana
2007/0167110 A1 7/2007 Tseng et al.

OTHER PUBLICATIONS

NI PCI-6100/6111 User Manul, Jul. 2003, NI.*
International Search Report and Written Opinion mailed Dec. 15, 2010 for PCT Application No. PCT/US2010/034081.

* cited by examiner

*Primary Examiner* — Hyun Nam
(74) *Attorney, Agent, or Firm* — Moser Taboada; Alan Taboada

(57) ABSTRACT

Apparatus and methods for providing an interface for a semiconductor processing tool are provided. In some embodiments, the apparatus may include an input/output bridge for receiving analog and state command system control signals from, and sending return data and status information to, a system controller, wherein the analog and state command system control signals are intended to control an analog device, and for converting the analog and state command system control signal into a digital system control signal intended to control a digital device; and an upper pneumatic assembly coupled to the input/output bridge for providing pressure control to one or more pressure zones located on a polishing apparatus coupled to the upper pneumatic assembly for the polishing of semiconductor wafers.

18 Claims, 7 Drawing Sheets

MODULAR INPUT/OUTPUT BRIDGE SYSTEM FOR SEMICONDUCTOR PROCESSING EQUIPMENT

CROSS-REFERENCE TO RELATED APPLICATIONS

This application claims benefit of U.S. provisional patent application Ser. No. 61/176,312, filed May 7, 2009, which is herein incorporated by reference in its entirety.

BACKGROUND

1. Field

Embodiments of the present invention generally relate to semiconductor processing equipment, and more particularly to interfacing with process controllers for such equipment.

2. Description of the Related Art

Equipment used for semiconductor processing typically requires components designed to operate in environmentally hostile areas. Such areas may contain hazardous temperatures, chemicals, vapors, or liquids. These areas are often "clean" areas with strict requirements and procedures for preventing outside contamination. Replacing a component in such an area often requires a complete shutdown of the processing tool while a technician replaces the failed component, after which the clean area must be recertified. This is a time, resource, and manpower intensive process.

For example, the polishing heads of CMP tools possess numerous mechanical and electrical components that create several different points of failure in such a clean environment. In many cases, it is undesirable to make changes to these components because such a change would upset a carefully configured system, resulting in decreased yields and other manufacturing defects. This risk causes many end users to be hesitant to upgrade their systems and instead accept problems and limitations of obsolete hardware.

Accordingly, there is a need in the art for an apparatus to provide an interface to the wafer polishing head that requires a minimum number of components to be present in the clean area, while also providing a transparent upgrade path for the end user of the device.

SUMMARY

An apparatus and method for providing an interface for a semiconductor processing tool is disclosed. In some embodiments, the apparatus may include an input/output bridge, a system controller, one or more upper pneumatic assemblies, and a polishing apparatus. The input/output bridge receives commands from and sends data to a system controller. The input/output bridge controls the upper pneumatic assemblies. The upper pneumatic assemblies provide polishing head pressure control for one or more pressure zones located on the polishing apparatus.

In some embodiments, an apparatus for providing an interface for a semiconductor processing tool may include an input/output bridge for receiving an analog and state command system control signals from and sending return data and status information to a system controller, wherein the analog and state command system control signals are intended to control an analog device, and for converting the analog and state command system control signal into a digital system control signal intended to control a digital device; and an upper pneumatic assembly coupled to the input/output bridge for providing pressure control to one or more pressure zones located on a polishing apparatus coupled to the upper pneumatic assembly for the polishing of semiconductor wafers.

In some embodiments, the method may include receiving one or more analog and state command system control signals from a system controller, converting the one or more analog and state command system control signals to a digital control signal, and transmitting the digital control signal to a digital device. The analog system control signals are intended to control an analog device. The analog and state command system control signals are converted to a digital signal using an input/output logic board, and the digital control signal is intended to control a digital device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
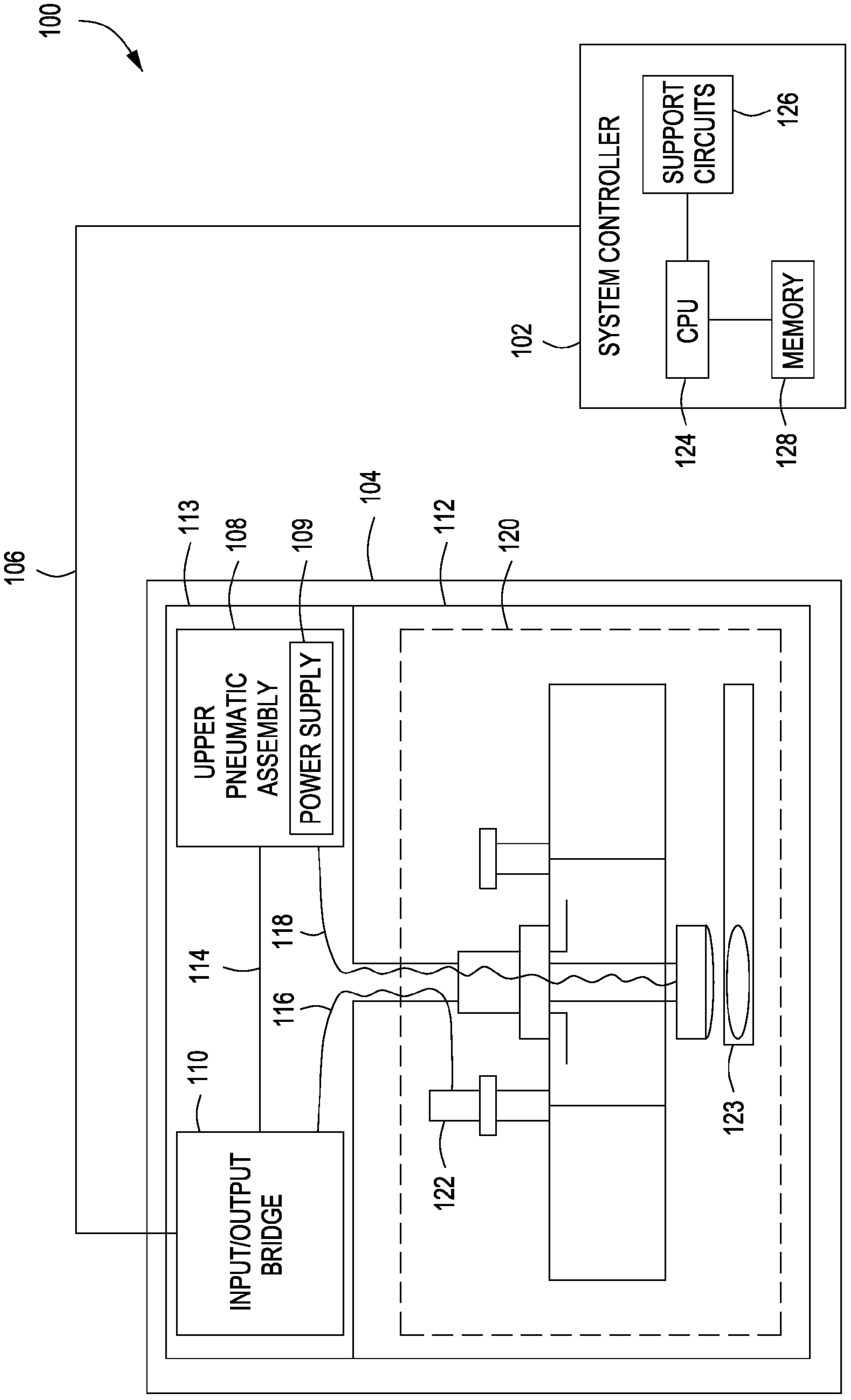
FIG. 1 depicts a block diagram of a system using an embodiment of the present invention to interface with a polishing head of a semiconductor processing tool.

The drawings have been simplified for clarity and are not drawn to scale. To facilitate understanding, identical reference numerals have been used, wherever possible, to designate identical elements that are common to the figures. It is contemplated that some elements of one embodiment may be beneficially incorporated in other embodiments.

DETAILED DESCRIPTION

An apparatus for providing an input/output bridge for semiconductor processing equipment, such as a chemical mechanical polisher, is described herein. The inventive apparatus advantageously provides for control of polishing head pressure controllers of a polishing tool without exposing certain components of the polishing tool to a hazardous operating environment. Additionally, the apparatus allows the polishing tool to seamlessly integrate digital pressure controllers transparently to the system controller while providing for input and output of health and state command data. Although described herein in connection with legacy systems, the present invention may also be implemented on newly manufactured systems and/or existing non-legacy equipment.

The present invention may be utilized to advantage in numerous processing systems currently configured with analog pressure controllers. Examples of suitable process tools include the 200 mm MIRRA® and MIRRA MESA® Chemical Mechanical Planarization (CMP) Polishers available from Applied Materials, Inc. of Santa Clara, Calif. One such suitable processing system is described in U.S. Pat. No. 6,572,730, issued Jun. 3, 2003, to Nitin Shah, entitled, "System and Method for Chemical Mechanical Planarization," and which is herein incorporated by reference in its entirety.

FIG. 1 depicts a schematic diagram of an exemplary integrated semiconductor substrate processing system 100, similar to a 200 mm MIRRA MESA® processing system in accordance with some embodiments of the present invention.

The system controller 102 is coupled to and controls modules and apparatus of the integrated processing system 100. The system controller 102 controls all aspects of operation of the system 100 using a direct control of modules and apparatus of the system 100 or, alternatively, by controlling the computers (or controllers) associated with these modules and apparatus. In operation, the system controller 102 enables data collection and feedback from the respective modules and apparatus that optimizes performance of the system 100.

The system controller 102 generally comprises a central processing unit (CPU) 124, a memory 128, and support circuits 126. The CPU 124 may be one of any form of a general purpose computer processor that can be used in an industrial setting. The support circuits 126 are conventionally coupled to the CPU 124 and may comprise cache, clock circuits, input/output subsystems, power supplies, and the like. The software routines, when executed by the CPU 124, transform the CPU into a specific purpose computer (controller) 102. The software routines may also be stored and/or executed by a second controller (not shown) that is located remotely from the system 100.

The system controller 102 is coupled to the process chamber 104 by a data line 106. The data line 106 comprises numerous, for example, over 200, separate wires that send and receive commands to the I/O bridge 110. Previously, the data line 106 was coupled directly to a polishing apparatus 120. Due to the rotation of the polishing apparatus 120 and the general hazards of the lower enclosure 112, individual wires in the data line 106 would frequently fail. Because of the large number of wires present in the line, it was more practical to replace the entire data line 106 rather than to locate and fix the individual failed wire. In addition to the cost involved in replacing the entire data line 106, this is a time consuming process that requires the clean area to be breached and the entire tool to be recertified, thus undesirably causing extended machine down-time.

The process chamber 104 is split into an upper enclosure 113 and a lower enclosure 112. The upper enclosure 113 may be a non-clean rated environment, while the lower enclosure 112 may be a clean environment. The upper enclosure 113 contains an I/O bridge 110 and one or more upper pneumatic assemblies (UPAs) 108 coupled to the system controller 102 and the polishing apparatus 120. The I/O bridge 110 is coupled to the system controller 102 by the data line 106. Unlike previous efforts in the art, the I/O bridge 110 and UPAs 108 are located in the upper enclosure 113, rather than at the tips of the polishing apparatus 120 in the lower enclosure 112. In some embodiments, a reduced-friction surface 130, such as a polytetrafluoroethylene (PTFE) sheet or the like, may be provided on at least a portion of a floor of the upper enclosure 113 to minimize friction between cables and lines routed between the upper and lower enclosures 113, 112 (e.g., 116, 118). In some embodiments, a ¼" PTFE sheet may be provided on the floor of the upper enclosure 113.

The I/O bridge 110 is coupled to one or more UPAs 108 by a UPA cable 114. While in the present embodiment the I/O bridge 110 is represented as a separate device from the UPAs 108, a person of ordinary skill in the art would recognize that the same functionality could be provided by a board built into the one or more UPAs 108 without the need for a UPA cable 114. In one embodiment, the UPA cable 114 may implement a communication protocol allowing data and information exchange between multiple devices along a single data path, such as a DEVICENET® interface. Such a communication protocol may be implemented with a master device and a series of slave devices, wherein the master device acts as a scanner to send commands to and to monitor for data transmissions from a plurality of slave devices. In some embodiments, the I/O bridge 110 performs similar functionality to the I/O logic board 202 and the I/O converter 510 discussed with respect to FIGS. 2 and 5, respectively. In some embodiments, of the present invention, the I/O bridge 110 functions as such a master device, and the UPAs 108 function as slave devices. In some embodiments, the communication protocol may be implemented as a packet switched or connection based network. The I/O bridge 110 provides a transparent interface to the UPAs 108 for the system controller 102. If the system controller 102 sends commands suitable for an analog UPA (different voltages corresponding to different pressures), the I/O bridge 110 interprets those signals into commands suitable for a digital UPA and forwards the commands to the UPAs 108.

The I/O bridge 110 is coupled to the polishing apparatus 120 by a sensor cable 116. In one embodiment, the sensor cable may be comprised of a single "super-flex" torsion-rated cable. The sensor cable 116 may be coupled to a breakout box 122.

The UPA 108 provides pressure control of the pressure zones present on a polishing head 123 in response to commands received from the system controller 102 via the I/O bridge 110. The UPA 108 is coupled to the polishing apparatus 120 by one or more pneumatic tubes 118. The pneumatic tubes 118 provide pressure control to one or more zones located on the polishing apparatus 120. The UPA 108 also supplies +24 V power to the I/O bridge 110 via a built-in power supply 109.

The lower enclosure 112 contains the semiconductor wafer to be polished and the polishing apparatus 120. The lower enclosure 112 is a dangerous environment. The polishing apparatus 120 moves and rotates during the polishing action and hazardous chemicals are present in solid, liquid, and vapor form. The lower enclosure 112 also has strict decontamination requirements. If the area is unsealed, the polishing tool must be deactivated until the enclosure is recertified.

The break out box 122 is coupled to one or more polishing heads 123. The breakout box 122 monitors sent to and received from the polishing head 123, such as "head home" and "wafer loss" signals. The breakout box 122 relays the signals to the I/O bridge 110. In some embodiments, the breakout box 122 may not be present and the polishing head 123 may send signals directly to the I/O bridge 110.

Figure 2:
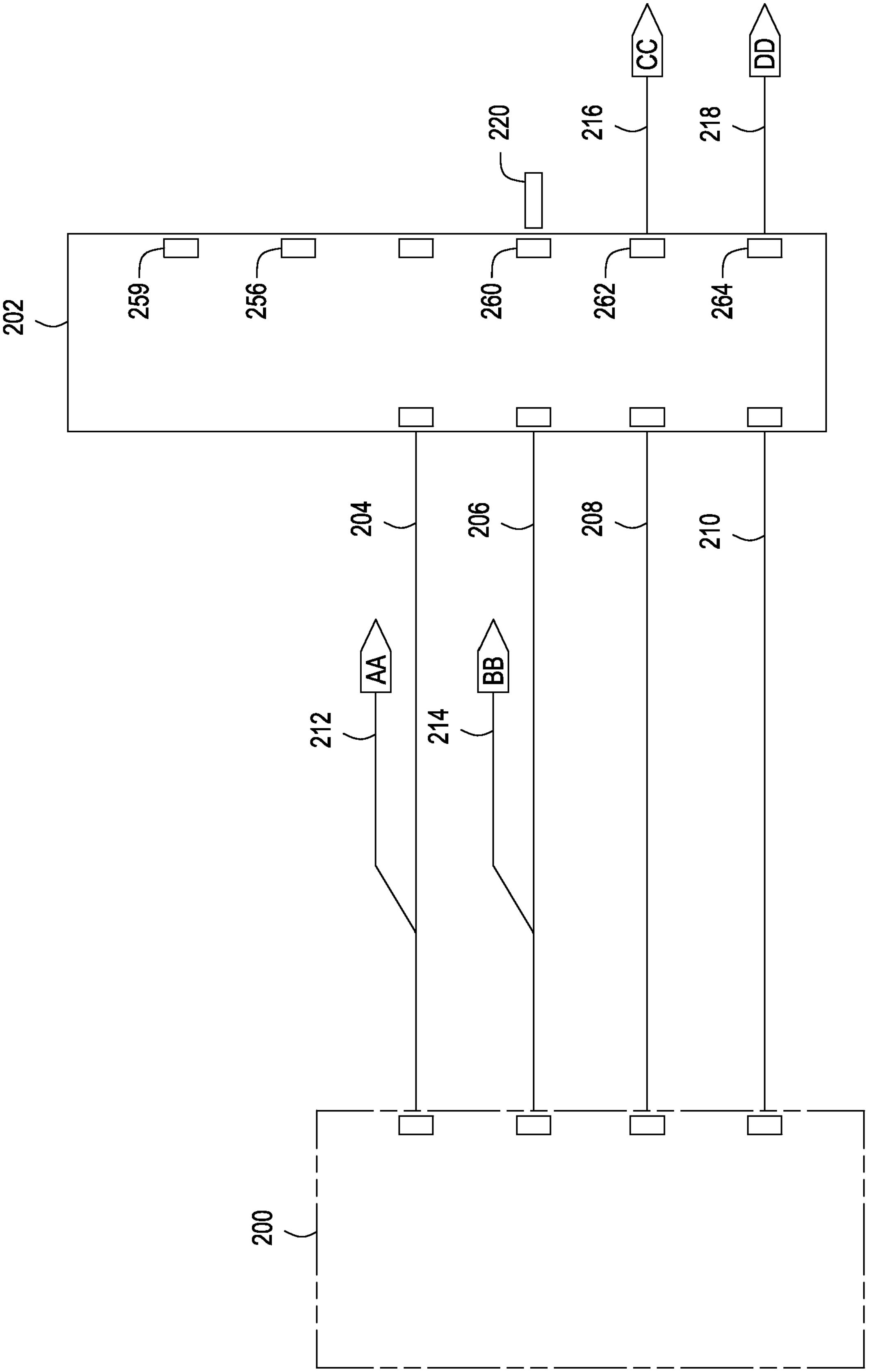
FIG. 2 depicts a schematic diagram of a system controller and input/output logic board in accordance with embodiments of the present invention.

FIG. 2 depicts a schematic diagram of an exemplary system controller 200 and input/output (I/O) logic board 202 in accordance with some embodiments of the present invention. The system controller 200 is operatively coupled to the I/O logic board 202 and a process chamber (such as the process chamber 104 depicted with respect to FIG. 1) via data lines 204, 206, 208, and 210. Additional breakout data lines 212 and 214 are coupled to the system controller 200 and data lines 204 and 206, respectively. In some embodiments, the system controller 200 is proximately located to the I/O logic board 202. For the purposes of this exemplary embodiment, the term "proximately located" is defined as where the I/O logic board 202 is located at a maximum distance of 3 feet from the system controller 200. Such embodiments allow the I/O logic board 202 to be located outside of the process chamber 104. Locating the I/O logic board 202 in this manner advantageously reduces the length of the data lines 204, 206, 208, and 210, and reduces the necessity to run long bundles of wires into the process chamber. The comparatively short length of the analog wires also eliminates the potential for interference and ground loop faults common with longer analog cables.

The system controller 200, as with the system controller 102 discussed with respect to FIG. 1, controls all aspects of operation of the system using a direct control of modules and apparatus of the system or, alternatively, by controlling the computers (or controllers) associated with these modules and apparatus. In operation, the system controller 200 enables data collection and feedback from the respective modules and apparatus that optimizes performance of the system. The system controller sends and receives data to and from the I/O logic board 202 via the data lines 204, 206, 208, and 210.

The data line 204 is operatively coupled to the I/O logic board 202, the system controller 200, and a sensor breakout cable 212. The functionality of the sensor breakout cable 212 is discussed further with respect to FIG. 3.

The data line 206 is operatively coupled to the I/O logic board 202, the system controller 200, and a distribution breakout cable 214. The functionality of the distribution breakout cable 214 is discussed further with respect to FIG. 3.

The data lines 208 and 210 are operatively coupled to the I/O logic board 202 and the system controller 200. Each of the four data lines 204, 206, 208, and 210 sends and receives analog data and state command signals to and from the I/O logic board 202 to and from the system controller 200. If the system controller 200 sends commands suitable for an analog UPA (different voltages corresponding to different pressures), the I/O logic board 202 interprets those signals into commands suitable for a digital UPA and forwards the commands to the UPAs, as discussed further with respect to FIG. 4. The I/O logic board may also interpret message frames returning from the digital UPA, translates these return messages in to analog and status responses and forwards these signals to the system controller 200.

In some embodiments, The I/O logic board 202 further comprises a service update port 254, a user port 256, an alternate UPA control line 260, a UPA control line 262, and a power interface 264. In some embodiments, the I/O logic board 202 provides conversion operations for various inputs in a similar manner to the I/O bridge 110 and I/O converter 510 discussed with respect to FIGS. 1 and 5, respectively. The service update port 254 provides an interface for performing maintenance and service operations on the I/O logic board 202, including updating software/firmware executing on the board. The user port 256 provides an interface for accessing and interfacing with data passing through the board, such as provided by various bus analyzer tools. The alternate UPA control line 260 provides a secondary interface for a data line coupled to the UPAs as discussed with respect to FIG. 4. The alternate UPA control line 260 may be terminated by a data line terminator 220 when not in use or an additional array of UPA devices may be connected.

Figure 4:
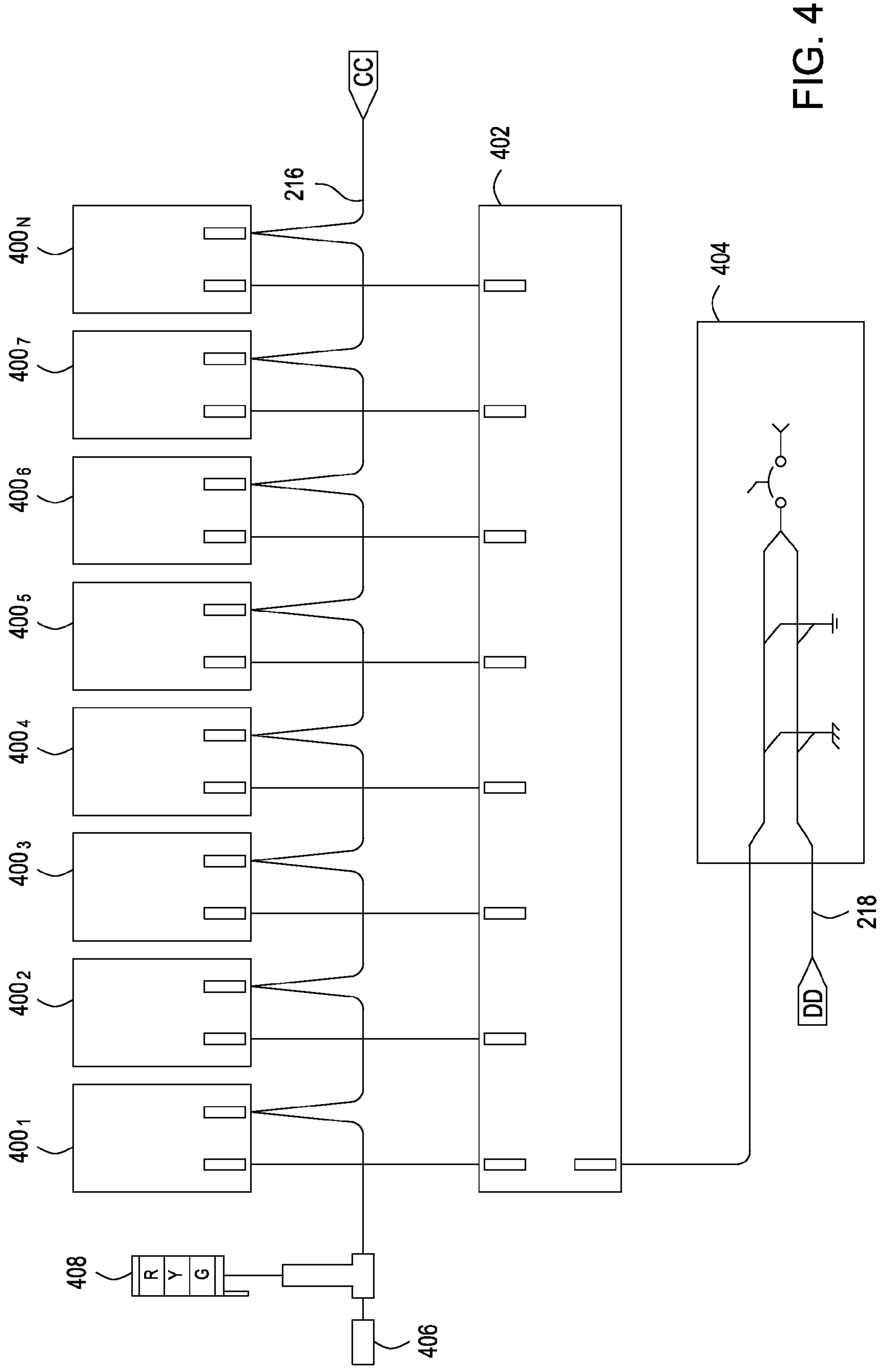
FIG. 4 depicts a schematic diagram of an upper pneumatic assembly and alternating current power source in accordance with embodiments of the present invention.

The UPA control line 262 provides an interface for a data line 216 used to send and receive signals from one or more UPA devices as discussed with respect to FIG. 4. The I/O logic board 202 provides for the conversion of analog signals as received from the system controller 200 into digital signals sent over the data line 216. The power interface 264 provides an interface for an alternating current (NC) line 218. The NC line 218 is coupled to an NC power distribution panel 404 as discussed further with respect to FIG. 4.

Figure 3:
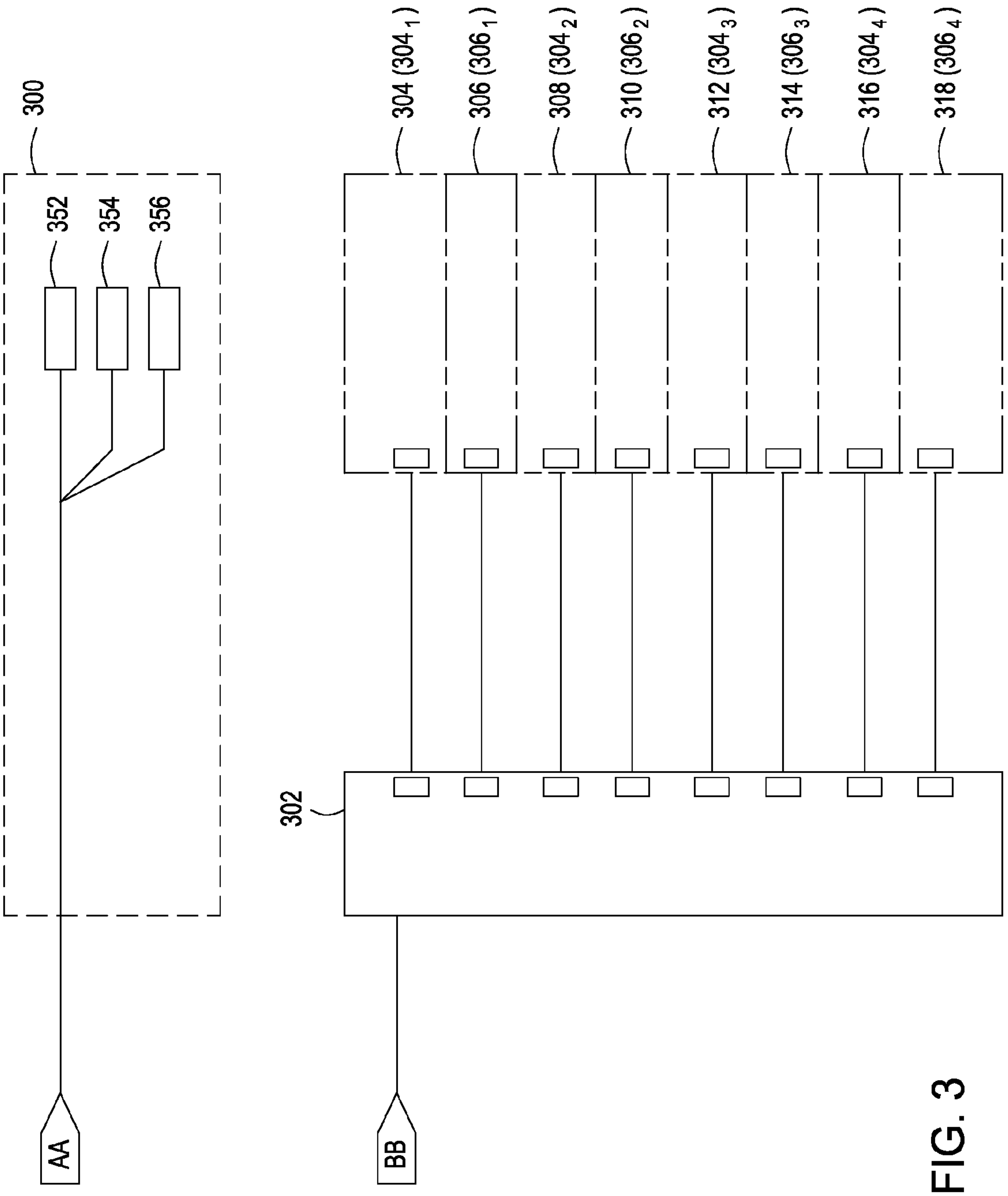
FIG. 3 depicts a schematic diagram of a distribution block and sensor block in accordance with embodiments of the present invention.

FIG. 3 depicts a schematic diagram of a sensor breakout cable interface 300 and a distribution block 302 in accordance with some embodiments of the present invention. The sensor breakout cable interface 300 is operatively coupled to the sensor breakout cable 212 as discussed with respect to FIG. 2. Such an interface is typically located underneath the polishing apparatus, separate from the polishing head. The sensor breakout cable interface 300 is comprised of a flow sensor 352, an ISRM power module 354 which provides a specialized process end point detection function, and a user AI/O module 356 which provides for analog input and output functions which are intended to be defined by the user of the equipment.

The distribution block 302 is operatively coupled to the system controller 200 via the distribution breakout cable 214. In some embodiments, the distribution breakout cable 214 is a bundle of individual signal wires bound into a single twist/torsion rated cable. Such a cable advantageously reduces the chance that any single wire or bundle of wires will break during operation of the polishing tool.

The distribution block 302 is coupled to a series of sensors 304-318 located on the polishing head, as discussed with respect to FIG. 1. In some embodiments, the distribution block 302 is located directly on the polishing head. The distribution block 302 breaks out individual sensor wires from the distribution breakout cable 214. In some embodiments, the individual sensors comprise a head sweep home sensor 304 ($304_1$-$304_4$ and wafer loss sensor 306 for each of four polishing heads.

FIG. 4 depicts a schematic diagram of a series of UPAs 400 and a UPA power supply 402 in accordance with embodiments of the present invention. The UPAs 400 send and receive data in a digital format to and from the I/O logic board 202 via the data line 216. Controlling the UPAs 400 digitally in this manner advantageously eliminates the need for multiple analog and state command wires to connect from the system controller 200 to the UPA assembly located in the upper chamber of the polishing tool. Instead of an assembly containing typically more than 140 individual wires, a single digital data line is sufficient to transmit and receive data to and from the UPAs. Although 8 separate UPAs 400 are shown in the present embodiment, one of ordinary skill in the art would recognize that a variable number of UPAs 400 would be appropriate depending upon the number of control zones and polishing heads present in the polishing tool. The UPAs 400 are coupled to a UPA power supply 402 to receive electrical power. The UPA power supply 402 receives electrical power from an NC power distribution panel 404 and whose DC output may in some embodiments be electrically isolated from the system ground and chassis common voltage potentials so as to preclude common mode voltage potentials from causing excursions to wafer processing parameters or damage to equipment. The NC distribution panel provides for an A/C power source as commonly known in the art.

The data line 216 is further coupled to a status indicator light 408, and terminated by a data line terminator 406. The status indicator light 408 provides for various status notifications of the operational state of the UPAs 400 and the system at large. The status indicator light 408 receives functions to display a status received from the system controller 200 via the data line 216 through the I/O logic board 202. The status indicator light 408 may be present in some embodiments or may not be present as required by the specific circumstances of the equipment installation and user requirements.

Figure 5:
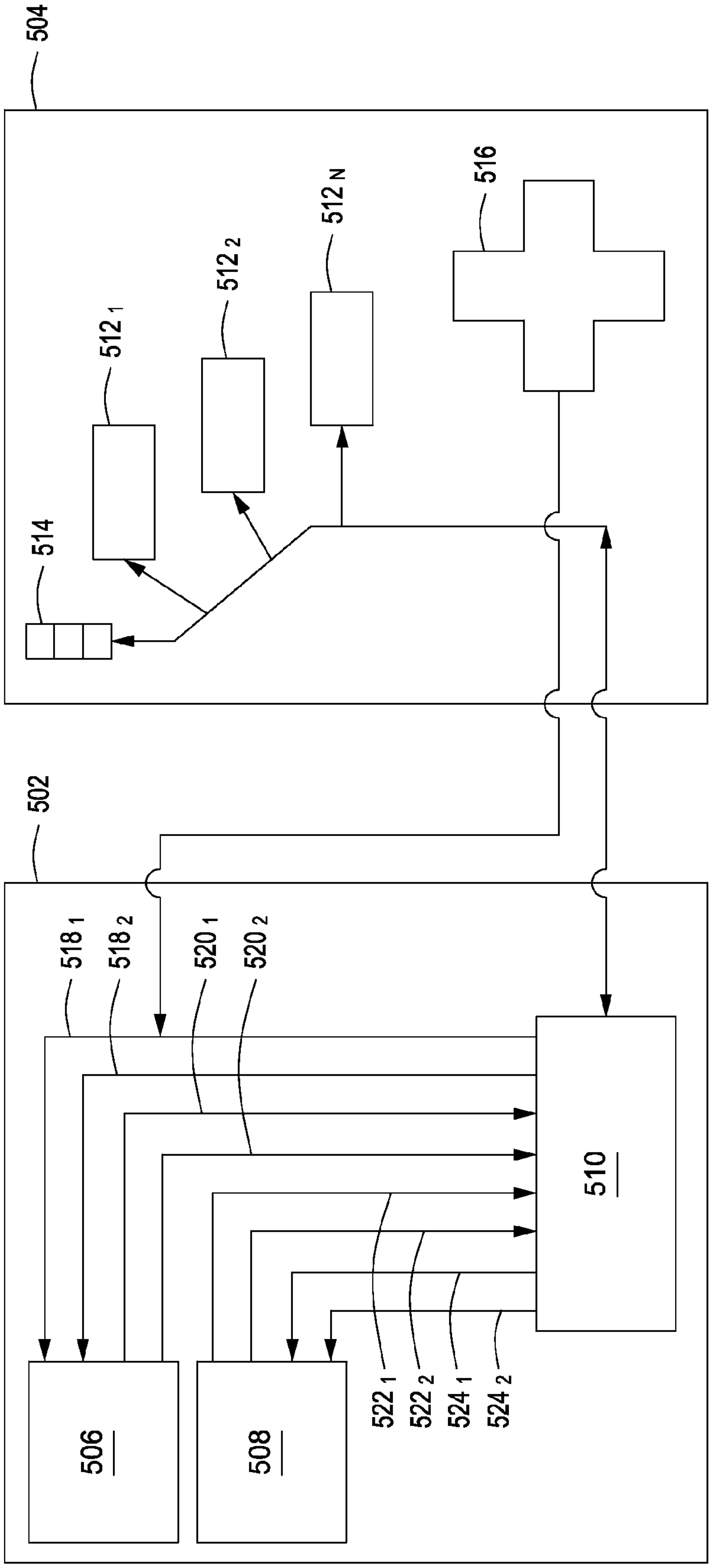
FIG. 5 depicts a block diagram of a series of electrical connections between a system controller and polishing tool in accordance with embodiments of the present invention.

FIG. 5 depicts a block diagram of the electrical communications between a system controller 502 and polishing tool 504 in accordance with embodiments of the present invention. The system controller 502 is comprised of one or more digital I/O printed circuit boards (PCBs) 506, one or more analog I/O PCBs 508, and an I/O converter 510. The polishing tool 504 is comprised of a status indicator light 514, one or more UPAs 512, and a cross polishing head 516.

The digital I/O PCBs 506 receive status signals 518 from the I/O convertor 510 and cross polishing head 516. The polishing head status signals flow into the same input as the status signals 518 received from the I/O converter 510. The I/O converter 510 may be implemented as a separate PCB to perform conversion operations. In some embodiments, the I/O converter 510 provides similar functionality to that of the I/O bridge 110 and the I/O logic board 202 described with respect to FIGS. 1 and 2, respectively. In some embodiments, the I/O converter 510 executes a process for performing conversion operations such as the process 700 discussed with respect to FIG. 7. In some embodiments the I/O converter 510 executes the process utilizing the CPU, memory, and support circuit resources of the system controller 102 as discussed with respect to FIG. 1. One of ordinary skill in the art would recognize that in some embodiments, such components may be implemented as a separate CPU, memory, and support circuits present on the I/O converter 510. In some embodiments, the process 700 may be encoded in hardware or firmware, or executed by an application specific interface circuit.

The digital I/O PCBs 506 send solenoid valve signals 520 to the I/O converter 510, where the solenoid valve signals 520 are transmitted to the UPAs 512 via a data cable 528.

The analog I/O PCBs 508 send pressure signals 522 to the I/O converter 510 the pressure signals 522 are then converted into a digital format and transmitted to the UPAs 512 via the data cable 528. The analog I/O PCBs 508 receive actual pressure signals 524 as converted by the I/O converter 510 after receipt from the UPAs 512 via the data cable 528.

The status indicator light 514 and UPAs 512 send and receive data and commands to and from the I/O converter in a digital format via the data cable 528.

The cross polishing head 516 sends and receives cross tip signals via a data line coupled to the digital I/O PCB 506 via the status signals 518 as received from the I/O converter 510. The cross tip signals are transmitted via a single torsion-rated cable that travels down the "waterfall" area to the cross-tip.

Figure 6:
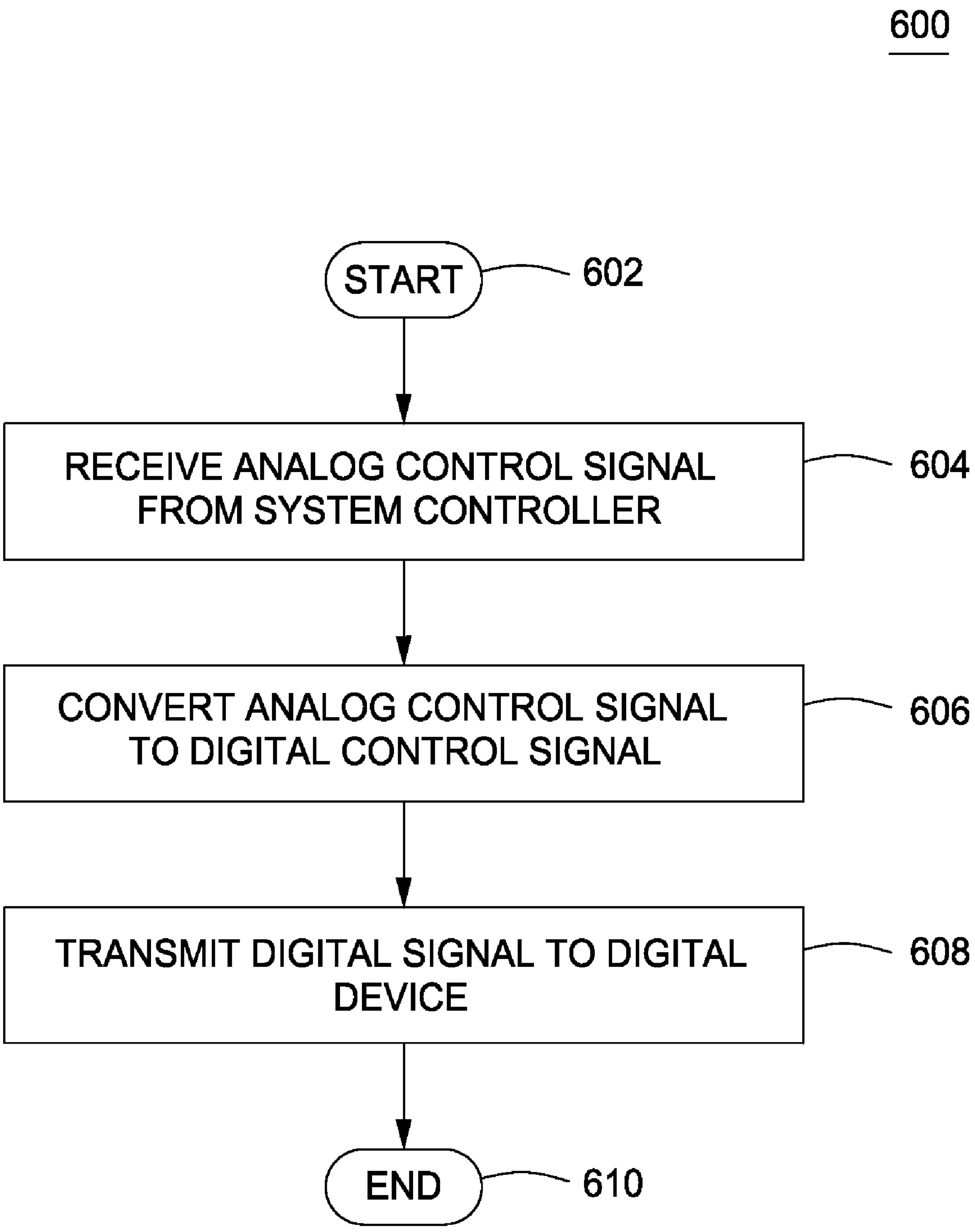
FIG. 6 depicts a flow diagram for providing an interface for a semiconductor processing tool in accordance with embodiments of the present invention.

FIG. 6 is a flow diagram depicting a method 600 for providing an interface for a semiconductor processing tool. The method begins at step 602. At step 604, the method receives an analog control signal from a system controller, such as the system controller 102 discussed with respect to FIG. 1, the system controller 200 discussed with respect to FIG. 2, or the system controller 502 discussed with respect to FIG. 5. The analog control signal received from the system control is intended to provide a control operation on an analog device. The method then proceeds to step 606.

At step 606, the analog control signal is converted to a digital control signal, suitable for controlling a digital device. In some embodiments the conversion is performed by an I/O bridge as present in an upper chamber of a polishing tool as discussed with respect to the I/O bridge 110 depicted in FIG. 1. In some embodiments, the conversion is performed by an I/O logic board 202 as discussed with respect to FIG. 2, or an I/O converter 510 as discussed with respect to FIG. 5. After the conversion is complete, the method proceeds to step 608.

At step 608, the method transmits the converted digital signal to the digital device. In some embodiments, the digital device is a UPA as discussed with respect to FIGS. 1, 4, and 5. The method ends at step 610 when the converted command has been transmitted.

Figure 7:
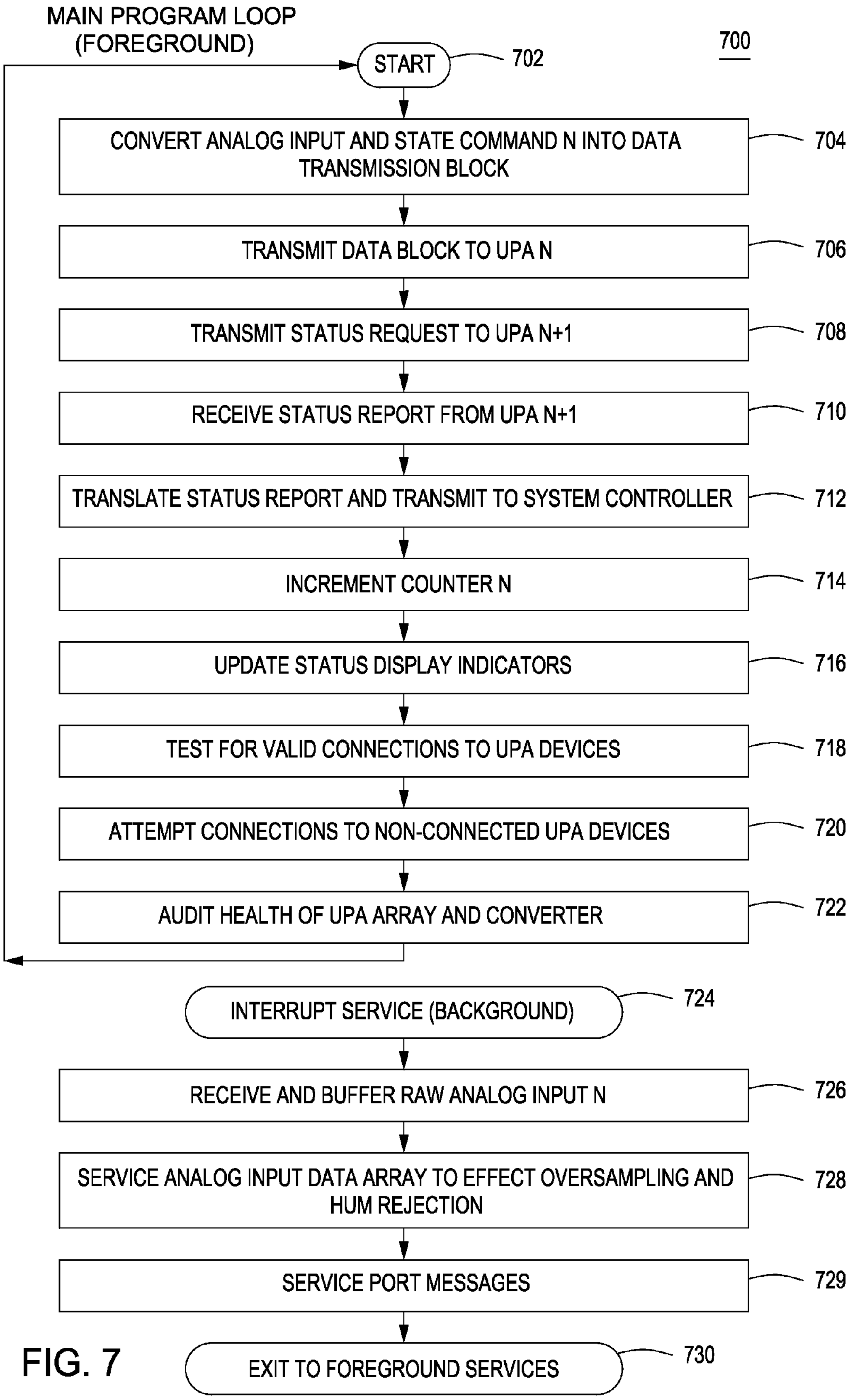
FIG. 7 depicts a flow diagram of a process for providing an interface for a semiconductor processing tool in accordance with embodiments of the present invention.

FIG. 7 depicts a detailed flow diagram of an embodiment of a conversion process 700 executing on the I/O bridge 110, the I/O logic board 202, and/or the I/O converter 510. The process begins at step 702 and proceeds to step 704. At step 704, the process converts a received analog input and state command into a data transmission block. Although the process is described as happening sequentially, the scanning (command and status) operations performed for the UPAs are always executed with the highest priority. Virtually any other task may be suspended or delayed in deference to keep the scanning operations occurring at consistent time intervals.

At step 706, the data block is transmitted to a destination UPA "N". The transmission may occur via the communication protocol interface as discussed with respect to FIG. 1. Once the data block has been transmitted, the process proceeds to step 708.

At step 708, the process sends a status request to the next UPA (UPA N+1) in a series. In the present example each UPA is assigned a particular logical unit number "n" and commands and status requests are sent to each UPA n in series. One of ordinary skill in the art would recognize that various communication protocols could be used to communicate with each UPA, including protocols which communicate in parallel rather than in series. Once the status request has been sent, the process proceeds to step 710.

At step 710, the process receives a status report from UPA N+1. The process proceeds to step 712. At step 712, the process translates the status report and transmits the translated report to the system controller, (e.g. the system controller 102, the system controller 200. or the system controller 502). The process then proceeds to step 714.

At step 714, the process increments the counter variable "n", a number that automatically restarts when the incremented variable exceeds the number of UPA devices actually present in the array. Incrementing this counter instructs the process to contact the next UPA in the series. Once the counter has been incremented, the process proceeds to step 716.

At step 716, the process updates one or more status display indicators, such as the status indicator lights 514, or a graphical user interface reflecting the status of devices coupled to the I/O bridge 110. After updating the status indicators, the process proceeds to step 718.

At step 718, the process tests for valid connections to the UPA devices 108. Testing for such connections in this manner allows the process to access and configure such devices automatically. After testing the UPA connections, the process proceeds to step 720.

At step 720, the process attempts to connect to non-connected UPA devices. In the same manner as step 718, the automatic connection process facilitates configuration and status reporting operations for the UPA devices. After attempting a connection to non-connected UPA devices, the process proceeds to step 722.

At step 722, the process audits the health of the UPA devices and I/O bridge to determine a system health. The statuses of the UPAs as determined in steps 710 through 720 allow the process to create a system health status encompassing the current statuses of each UPA. Internal diagnostics provide the ability to determine the health of the I/O bridge/converter. After determining the health of the UPAs and I/O bridge, the process returns to step 702 to continue the loop.

Steps 724 through 730 describe an interrupt service 724 that is executed in a background loop to the main process loop described with respect to steps 702 through 722. At step 726, the interrupt service 724 receives an analog input intended for a UPA N. At step 728, the interrupt service 724 services the analog input (as stored in a data array) to perform oversampling operations and "hum" rejection. The interrupt service 724 then proceeds to step 729 to process messages received on the service ports.

At step 729, the interrupt service 724 executes a function to process the servicing of incoming and outgoing messages on either of the two service ports. After finishing processing of the service port messages, the process returns to the main execution loop depicted from steps 702 through 722. The process 700 continues to loop until terminated.

The I/O bridge 110, I/O logic board 202, and I/O converter 510 provide several important advantages over previous efforts in the art. The bridge, logic board, and converter provide transparent bidirectional emulation of signals to and from the UPAs 108 and the system controller 102, and allows the UPAs 108 to be removed to the safer, more accessible upper enclosure 113. The ability to use digital UPAs advantageously allows more precise pressure values to be used, and reduces the risk of pressure drift caused by time and temperature changes. This allows the polishing tool 104 to require less frequent maintenance and longer uptime. By providing an interface in the upper enclosure 113, the data line 106 is no longer coupled to the polishing apparatus 120 and therefore less likely to fail due to the hazards of the lower enclosure 112. Additionally, when a failure does occur in either the data line 106 or a UPA 108, the lower enclosure 112 no longer needs to be breached to effect repairs, saving the time and cost of cleaning and recertifying the clean area.

The invention also provides for analog pressure command and measurement signal conversions for each of up to 24 (typical) head pressure zones. The conversions are scalable to fewer or additional zones if required. The invention further provides digital command and status signal conversions in the same manner.

The bridge and board further provide for routing and grouping of the combinations of analog and digital signals (both outbound and inbound) to work with the groupings and types of digital UPA controls and the pre-existing system controls. Such controls are typically not logically or physically grouped in a like manner. The instant invention further provides plug and wire compatibility for the polishing tool via the interface ports 254 and 256 to allow plug and play maintenance and interface operations. The instant invention further provides message sequencing, interleaving and error detection and correction functions as may be appropriate for the nature and operation of the UPA devices 108.

In order to reduce ambient electrical and radio frequency field noise, the I/O bridge and I/O logic board further provide for the use of adaptive oversampling techniques (variable rate and number). For example, 16×, 32×, and the like oversampling may be performed at from 80 to 240 completed sample sequences per second. The instant invention is engineered expressly for rejection of 50 and 60 hertz electrical interference and local "hum" by oversampling and non-integral multiples of the local line frequencies.

The invention further provides for automatic detection of the digital UPA array configuration and adaptive behavior to accommodate same, along with error sensing and correction. The I/O bridge and board allow for integral communications channels and data format conversions to support a graphical user interface (GUI), and serial firmware update functions. By providing an interface for digital UPAs, the board and bridge allow for integral high precision (for example, +/−0.002%) voltage reference for enhanced analog conversion accuracy and stability, integral device scanner and message parsing functions preventing the need for separate scanner hardware, and integral accommodation for a membrane breakage detection scheme (separate IA) by means of local digital input array.

The elimination of most of the wiring between the UPA area on top of the polisher (newer style as per drawings below) and the system controller eliminates several expensive cables and reduces maintenance costs. The reduction of the length of the analog cabling further facilitates the elimination of analog ground loops between the system controller and the polishing area for pressure control and feedback functions.

The incorporation of auto zero functions allows for allow automatic UPA zeros and recalibrations at specified intervals. Self-calibration and self-test functions are further incorporated into the device firmware while using minimal external hardware and tools. Local status indicators (for example, LEDs) show proper UPA device connections and message exchanges as well as a DNET interface to an optional light bar status indicator, and the overall modular design of the apparatus reduces wiring and enhances manufacturability.

While the foregoing is directed to embodiments of the present invention, other and further embodiments of the invention may be devised without departing from the basic scope thereof.

What is claimed is:

1. An apparatus for providing an interface for a semiconductor processing tool comprising:

an input/output bridge (a) to receive analog and state command system control signals from, and send return data and status information to, a system controller, wherein the analog and state command system control signals are configured to control an analog device, and (b) to convert the analog and state command system control signals into digital system control signals configured to control a digital device; and an upper pneumatic assembly coupled to the input/output bridge to provide pressure control to one or more pressure zones located on a polishing apparatus coupled to the upper pneumatic assembly for the polishing of semiconductor wafers, wherein the polishing apparatus is coupled to the input/output bridge and configured to provide wafer loss and head home signals to the input/output bridge.

2. The apparatus of claim 1, wherein the digital device is the upper pneumatic assembly.

3. The apparatus of claim 1, wherein the input/output bridge is coupled to the upper pneumatic assembly via a communication interface, wherein the communication interface provides for communication between the input/output bridge and a plurality of devices via a single data path.

4. The apparatus of claim 3, wherein the communication interface is implemented in a master/slave configuration, and the input/output bridge is configured as a master device.

5. The apparatus of claim 4, wherein the upper pneumatic assemblies are configured as slave devices.

6. The apparatus of claim 3, wherein the plurality of devices are a plurality of upper pneumatic assemblies.

7. The apparatus of claim 1, further comprising a distribution block present on the polishing apparatus coupled to the system controller via a single torsion-rated cable, and wherein the distribution block provides an interface for the wafer loss and head home signals.

8. The apparatus of claim 1, wherein the input/output bridge is further configured to perform routing and grouping operations on one or more input signals to communicate with the groupings and types of the upper pneumatic assemblies.

9. The apparatus of claim 1, wherein the input/output bridge further comprises a service/update port for performing maintenance operations on the polishing tool.

10. The apparatus of claim 1, wherein the upper pneumatic assembly is configured to send and receive data using digital communications.

11. The apparatus of claim 1, wherein the upper pneumatic assembly is a plurality of upper pneumatic assembly devices controlled by a single digital interface cable.

12. The apparatus of claim 1, further comprising a status indicator light coupled to the input/output bridge for displaying one or more status indications.

13. The apparatus of claim 12, wherein the status indicator light is further coupled to the upper pneumatic assemblies and the input/output bridge via a single digital interface cable.

14. A method for providing an interface for a semiconductor processing tool comprising:

receiving one or more analog and state command system control signals from a system controller, wherein the analog and state command system control signals are configured to control an analog device;

converting the one or more analog and state command system control signals to a digital control signal using an input/output logic board, wherein the digital control signal is configured to control a digital device; and transmitting the digital control signal to the digital device, wherein a polishing apparatus is coupled to the input/output logic board and configured to provide wafer loss and head home signals to the input/output logic board.

15. The method of claim 14, wherein the digital device is a digital upper pneumatic assembly.

16. The method of claim 14, wherein the transmitting step further comprises transmitting the digital control signal via a communication interface, wherein the communication interface allows communication to a plurality of devices via a single data path.

17. The method of claim 16, wherein the communication interface is implemented in a master/slave configuration.

18. The method of claim 14, wherein the control signals comprise at least one of a solenoid valve signal and a pressure signal.

* * * * *

UNITED STATES PATENT AND TRADEMARK OFFICE

CERTIFICATE OF CORRECTION

PATENT NO. : 8,346,980 B2
APPLICATION NO. : 12/775258
DATED : January 1, 2013
INVENTOR(S) : Ronald Vern Schauer It is certified that error appears in the above-identified patent and that said Letters Patent is hereby corrected as shown below:

In the Specifications:

In column 6, line 54, delete “NC” and substitute therefor --A/C--;
line 56, delete “NC” and substitute therefor --A/C--.

Signed and Sealed this
Ninth Day of July, 2013

Teresa Stanek Rea
*Acting Director of the United States Patent and Trademark Office*